United States Patent [19]

Yonehara

[11] Patent Number: 5,457,058
[45] Date of Patent: Oct. 10, 1995

[54] CRYSTAL GROWTH METHOD

[75] Inventor: Takao Yonehara, Atsugi, Japan

[73] Assignee: Canon Kabushiki Kaisha, Tokyo, Japan

[21] Appl. No.: 998,765

[22] Filed: Dec. 30, 1992

Related U.S. Application Data

[63] Continuation of Ser. No. 593,975, Oct. 9, 1990, abandoned.

[30] Foreign Application Priority Data

Oct. 9, 1989 [JP] Japan ................... 1-262161

[51] Int. Cl.$^6$ ................................ H01L 21/265
[52] U.S. Cl. ................. 437/24; 117/94; 117/103; 437/173; 437/973
[58] Field of Search ............... 156/603, DIG. 73; 437/24, 40, 173, 174, 233, 247, 248, 973; 117/84, 94, 95, 97, 103

[56] References Cited

U.S. PATENT DOCUMENTS

| | | | |
|---|---|---|---|
| 4,379,020 | 4/1983 | Glaeser et al. | 156/603 |
| 4,466,179 | 8/1984 | Kasten | 437/174 |
| 4,693,759 | 9/1987 | Noguchi et al. | 437/24 |
| 4,694,143 | 9/1987 | Nishimura et al. | 118/725 |
| 4,727,044 | 2/1988 | Yamazaki | 437/101 |
| 4,775,641 | 10/1988 | Duffy et al. | 437/174 |
| 4,808,546 | 2/1989 | Moniwa et al. | 437/41 |
| 4,885,052 | 12/1989 | Fan et al. | 156/603 |
| 4,904,611 | 2/1990 | Chiang et al. | 437/24 |
| 4,992,846 | 2/1991 | Sakakibara et al. | 437/973 |

FOREIGN PATENT DOCUMENTS

| | | | |
|---|---|---|---|
| 0020134 | 10/1980 | European Pat. Off. | |
| 0308166 | 3/1989 | European Pat. Off. | |
| 0422864 | 4/1991 | European Pat. Off. | 156/603 |
| 58-56406 | 4/1983 | Japan . | |
| 0056409 | 4/1983 | Japan | 437/101 |
| 58-169905 | 6/1983 | Japan . | |
| 0031068 | 2/1984 | Japan | 437/24 |
| 0066471 | 4/1985 | Japan | 437/174 |
| 60-143624 | 7/1985 | Japan . | |
| 0078119 | 4/1986 | Japan | 437/174 |
| 0116821 | 6/1986 | Japan . | |
| 0203682 | 9/1986 | Japan | 437/101 |
| 0137819 | 6/1987 | Japan | 437/24 |
| 62-119914 | 6/1987 | Japan | 156/603 |
| 62-263627 | 11/1987 | Japan | 156/603 |
| 63-56912 | 3/1988 | Japan | 437/174 |
| 63-192223 | 8/1988 | Japan | 156/603 |
| 63-253616 | 10/1988 | Japan . | |
| 0254720 | 10/1988 | Japan | 156/603 |
| 1239093 | 9/1989 | Japan | 156/603 |
| 1239094 | 9/1989 | Japan | 156/603 |
| 0033934 | 2/1990 | Japan | 437/174 |
| 0103925 | 4/1990 | Japan | 437/101 |
| 3-096223 | 4/1991 | Japan | 156/603 |
| 3-120715 | 5/1991 | Japan | 156/603 |
| 8904550 | 5/1989 | WIPO . | |

OTHER PUBLICATIONS

"Solid Phase Epitaxy of LPCVD Amorphous Silicon Films," M. K. Hatalis et al., Journal of the Electrochemical Society, vol. 134, No. 10, Oct. 1987, pp. 2536–2540.

Primary Examiner—R. Bruce Breneman
Assistant Examiner—Felisa Garrett
Attorney, Agent, or Firm—Fitzpatrick, Cella, Harper & Scinto

[57] ABSTRACT

A crystal growth method for applying a crystallization treatment onto an amorphous film which includes injecting ions of the constituent material of the film into the film applied with the crystallization treatment provided with a mask to form a first region and a second region made amorphous by the ion injection, and growing a crystal from the first region to the second region by solid phase growth.

19 Claims, 4 Drawing Sheets

CRYSTAL GROWTH METHOD

This application is a continuation of application Ser. No. 07/593,975 filed Oct. 9, 1990, now abandoned.

BACKGROUND OF THE INVENTION

1. Field of the Invention

This invention relates to a method for growth of crystal, particularly to a method for growth of crystal which forms a crystalline film by crystallization of an amorphous film by solid phase growth.

2. Related Background Art

As one method in the field of crystal formation technique for growing a crystalline thin film on a substrate such as amorphous substrate, or the like, there has been proposed a method in which an amorphous thin film previously formed on a substrate is subjected to solid phase growth by annealing at a low temperature not higher than the melting point of the amorphous thin film. For example, there has been reported a crystal formation method in which an amorphous Si thin film with a film thickness of about 100 nm formed on an amorphous $SiO_2$ surface is annealed at 600° C. in $N_2$ atmosphere to crystallize the above-mentioned amorphous Si thin film, whereby a polycrystalline thin film with a large grain size of about 5 μm is formed (T. Noguchi, H. Hayashi and H. Ohshima, Mat. Res. Sos. Symp. Proc., 106, Polysilicon and Interfaces, 293, (Elsevier Science Publishing, New York, 1988)). The surface of the polycrystalline thin film obtained by this method remains flat and therefore can be formed as such into an electronic device such as an MOS transistor or diode. Also, since those devices thus obtained have polycrystals of larger than average grain sizes of polycrystals than the polycrystalline Si, etc. to be used by conventional Si IC process deposited by the LPCVD method, those having relatively higher performances can be obtained.

However, in the crystal formation method, although crystal grain sizes are large, their distribution and the position of the crystal grain boundary are not controlled. Since crystallization of the amorphous Si thin film is based on the solid phase growth of the crystal nuclei generated randomly within the amorphous by annealing, the positions of the grain boundaries are also formed randomly. As a result, the grain size will be distributed over a wide range. Therefore, the following problems to be described below arise for crystals with large average grain sizes.

For example, in MOS transistors, since the size of the gate becomes equal to or smaller than the average crystal grain size, and therefore portions containing no grain boundary and portions containing several boundaries will be formed at the gate portion. Electrical characteristics will change greatly between the portion containing no grain boundary and the portion containing several boundaries. Accordingly, a great variance will occur in the characteristics among a plurality of devices, and the variance in crystal grain size has been a significant obstacle in integrated circuit when forming an integrated circuit, or the like.

Figure 1A:
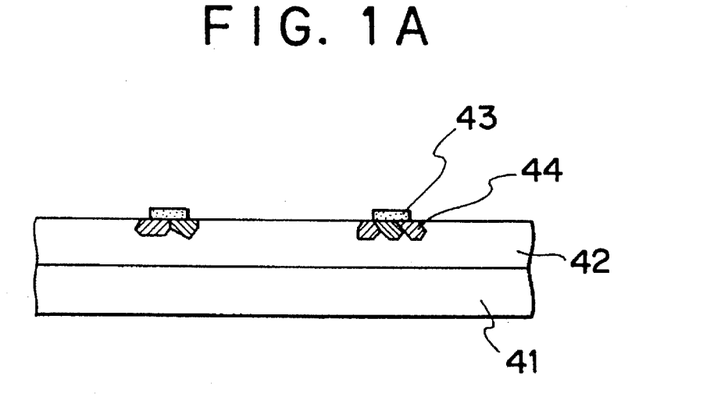
FIGS. 1A, 1B and FIG. 2 are schematic longitudinal sectional views showing the crystal growth method of the prior art.
Figure 1B:
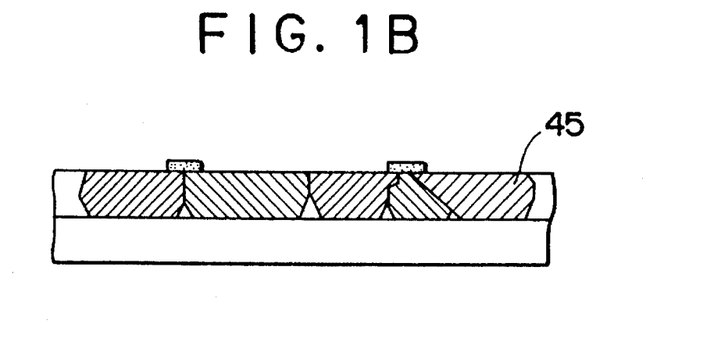

Attempts to solve the problems associated with large grain size polycrystalline thin film produced by the solid phase crystallization described above have been proposed. A method of inhibiting variance in grain size has been proposed in Japanese Laid-open Patent Application No. 58-56406. This method is described by use of FIG. 1. First, as shown in FIG. 1A, on the surface of an amorphous Si thin film 42 formed on an amorphous substrate 41, a small thin film strip 43 is provided, and the whole substrate is subjected to annealing in a conventional heating furnace. Then, nucleus formation of the crystal nucleus 44 occurs preferentially at the site in the amorphous Si thin film 42 where it contacts surrouding of the thin film strip 43. Accordingly, when the crystal nucleus is further permitted to grow, the amorphous Si thin film 42 is crystallized over the entire region to provide a polycrystalline thin film comprising a group of crystal grains 45 with large grains sizes as shown in FIG. 1B. According to the above-mentioned Japanese Laid-open Patent Application No. 58-56406, it is stated that the variance in grain size can be reduced in this method to about ⅓ as compared with the method of the prior art as described above.

However, even such result is still insufficient. For example, when thin film strips 43 are arranged in lattice shape with intervals of 10 μm, the variance in grain size can be controlled only within the range of 3 to 8 μm. Further, concerning control of the crystal grain boundary position, substantially no control has been attained under the present situation. The reason is that, because preferential nucleus formation occurs around the thin film strip 43 due to the localized effect of elastic energy at the portion where the amorphous Si thin film 42 contacts the surrounding of the thin film strip 43, a plurality of nuclei are generated along the surrounding and also its number can be controlled with difficulty.

Figure 2:
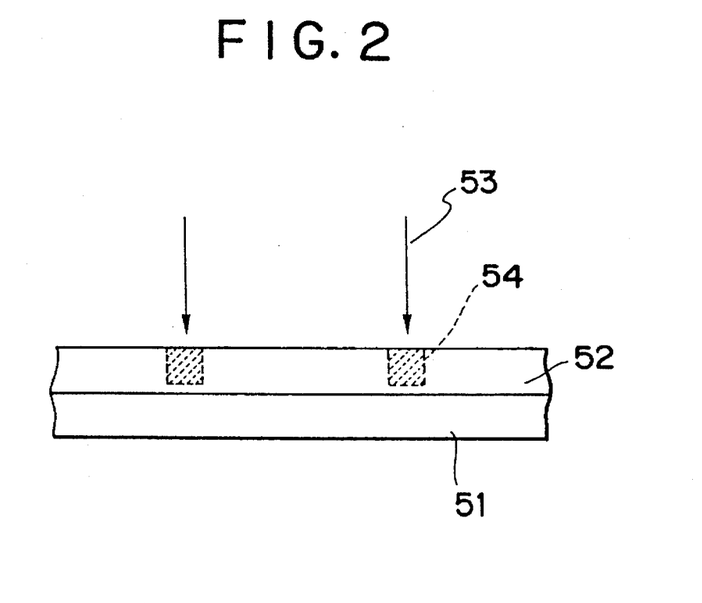

Concerning the method of controlling the nucleation position in the solid phase growth of amorphous Si thin film, there is another proposal in Japanese Laid-open Patent Application No. 63-253616. As shown in FIG. 2(53 represents ions other than Si and 54 is a region injected with ions), in that methods, region 54 injected with ions 53 other than Si is provided locally at the amorphous Si thin film 52 on the amorphous substrate 51, and crystal nuclei are generated preferentially there. As the ions 53 other than Si, N and B have been proposed. However, in such method actual selectivity concerning nucleation is deficient between the region 54 injected with ions and other regions. Further, there has been no report of the practicality of the method.

SUMMARY OF THE INVENTION

The present invention is intended to solve the problems associated with the prior art examples described above. An object of the present invention is to provide a method for growth of crystal, which can control the crystal growth base point in solid phase, enlarge the crystal region and also can form a crystal with narrowed grain size distribution.

Another object of the present invention is to provide a method for growth of crystal which can form a thin film which is flat and also great in grain size.

Still another object of the present invention is to provide a method for growth of crystal which can enlarge the grain size, narrow the grain size distribution, and further control freely the position of the crystal grain boundary formed mutually by the adjoining crystal grains and also the grain size, thereby forming various devices with little variance over a large area.

Still another object of the present invention is to provide a crystal growth method, which comprises:

applying a crystallization treatment on an amorphous film, injecting ions of the constituent material of the film into the film applied with the crystallization treatment provided with a mask to form a first region and a second region made amorphous by the ion injection, and growing a crystal from the first region to the second region by solid phase growth.

DESCRIPTION OF THE PREFERRED EMBODIMENTS

In the following, detailed function and constitution of the present invention are described along with the knowledges obtained in accomplishing the present invention.

The point of the present invention resides in how to control the position where the crystal grows in solid phase. That is, it resides in how to arrange a crystal growth base point in an amorphous thin film and permit a crystal to elongate preferentially therefrom and inhibit nucleus generation in other regions.

The present inventors have found a phenomenon that, in depositing a polycrystalline layer on a subbing material of, for example, $SiO_2$, then making the polycrystalline Si layer amorphous by injection of Si ions and then at the time of heat treatment, the crystal nucleus generation temperature (crystallization temperature) depends strongly on the ion injection energy.

Accordingly, the reason why the crystal nucleus generation temperature depends on ion injection energy has been investigated to find out the following fact. In the following, the details of the fact are described in detail.

When the injection energy is varied, the distribution of the Si ions injected changes in the Si layer after being made amorphous (amorphous Si layer), and as a result, the distribution of the voids, namely the distribution in region where injected damages exist will change by the injected energy in the film thickness direction.

Also, within the amorphous substance, nuclei which overcome the surface energy disadvantage are formed and thereafter phase transfer from the amorphous phase of Si atoms to the crystal phase will occur.

Whereas, nucleus formation includes uniform nucleation and nonuniform nucleation, with the former being nucleation in a uniform substance (e.g. internally of amorphous Si film), and whether such nucleation occurs or not depends on whether it can be enlarged by overcoming the surface energy disadvantage or not. On the other hand, in the latter nonuniform nucleation, nucleus generation is urged by contact with a foreign matter, and the activation energy in the latter is lower than in the former. Thus, nonuniform nucleation is will more readily occur rather than uniform nucleation. Practically, nucleation in amorphous Si thin film is controlled primarily by nonuniform nucleation at the vicinity of the subbing interface.

The present inventors have found that injection depth of ion injection (projected flying distance) has a serious influence on nonuniform nucleation at the interface as described above even under the conditions of constant injection amount.

Figure 3:
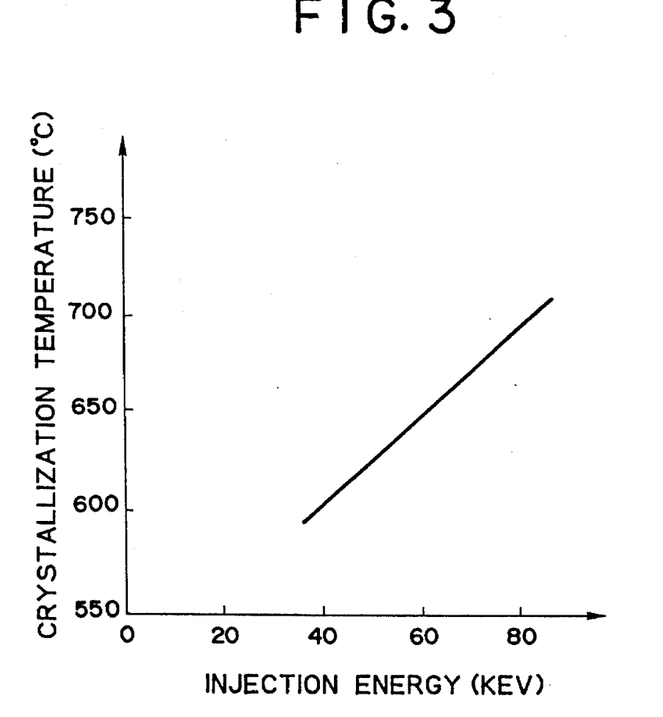
FIG. 3 is a graph showing the relationship between the injection energy and the crystallization temperature.

FIG. 3 is a graph showing the relationship between the injection energy and the crystallization temperature.

The conditions at this time are as described below. The injection layer is a polycrystalline Si layer with a thickness of 100 nm deposited on an $SiO_2$ substrate by use low pressure CVD by decomposition of $SiH_4$ at 620° C., and the injected ion is $Si^+$. The amount injected was constant (in this case $5 \times 10^{15} cm^{-2}$) beyond the critical injection amount (about $10^{15} cm^{-2}$). The injection energy is varied from 40 keV to 80 keV, and the injection layer is subject to ion collision to have Si atoms knocked on from the lattice position, whereby the damaged region becomes continuous by injection at a level of the critical injection amount or more to be made amorphous. The amorphous Si layer is subjected to heat treatment at the respective temperatures in $N_2$ atmosphere for 20 hours, and the recrystallization process in solid phase was observed primarily by use of a transmission electron microscope for examination of the crystallization temperature under the above conditions.

Figure 4:
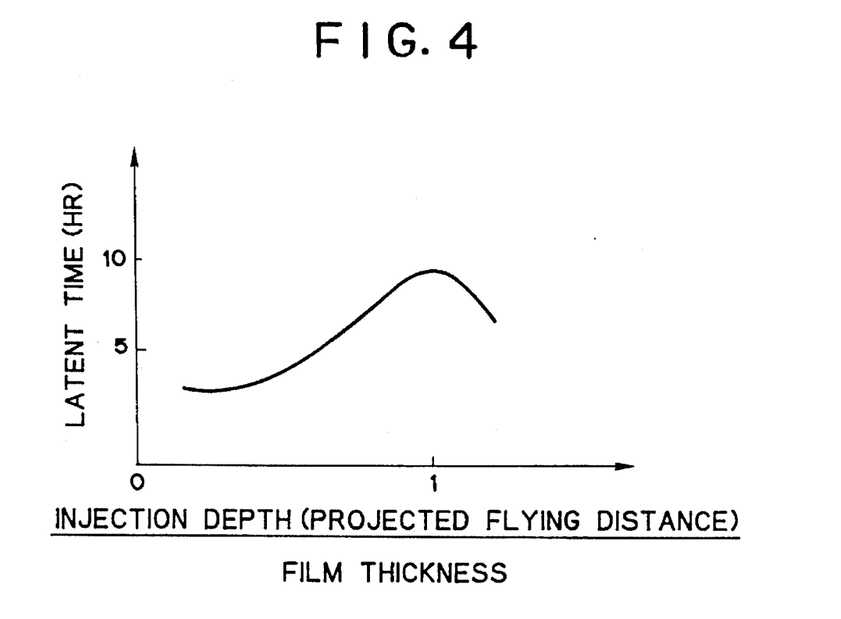
FIG. 4 is a graph showing the relationship between the projected flying distance and the latent time.

For example, to call attention on the injection energies of 40 keV, 70 keV, the injection depths (projected flying distances) of 40 keV and 70 keV are respectively 55.2 nm and 99.7 nm, and these are within the layer of 100 nm, corresponding to the vicinity of the film thickness center and the vicinity of the interface with the subbing material. There is a difference of 50° C. or higher between those crystallization temperatures, and the one injected into the vicinity of the subbing interface has higher crystallization temperature, indicating that it can be hardly crystallized. This may be considered to be due to the greater damage region up to the interface, whereby nonuniform nucleation has been inhibited. Further, when, at a temperature at which a layer made amorphous by injection at 40 keV so that the projected flying distance came to the vicinity of the film thickness center and the amorphous layer deposited by CVD are crystallized within 1 hour (namely 600° C.), a layer which has been made amorphous so that the injection depth came to the interface vicinity at 70 keV was subjected to heat treatment, it was confirmed by a transmission electron microscope that this layer was not crystallized after elapse of 100 hours or longer. Its manner, namely the relationship between the time from the heat treatment commencement to the crystallization commencement (latent time) and the injection depth is shown in FIG. 4. As shown in FIG. 4, as the injection depth becomes deeper toward the interface, the latent time is elongated to make crystallization more difficult. The position where (injection depth)/(film thickness) is approximately equal to 1 is the place where the interface vicinity is most susceptible to damage, having the point at which the latent time becomes the maximum.

From the above facts, by varying the injection energy, it has been observed that the crystallization temperature and the latent time become different, and the causes therefor may be judged to be due to inhibition of nonuniform nucleation at the vicinity of the interface.

The present invention is intended to control the nucleation position by utilizing the phenomenon as described above, and by injecting ions of the constituent substance of an amorphous thin film so that residual crystal fine region free from injection damage may be formed at a desired position within the amorphous thin film, and subsequently performing heat treatment at a temperature of the melting point of the amorphous thin film or lower, the crystal region is preferentially enlarged from the fine region.

The present invention is described in detail below about Examples by referring to the drawings.

First, prior to description of Examples of the present invention, the embodiments of the present invention are described.

Figure 5A:
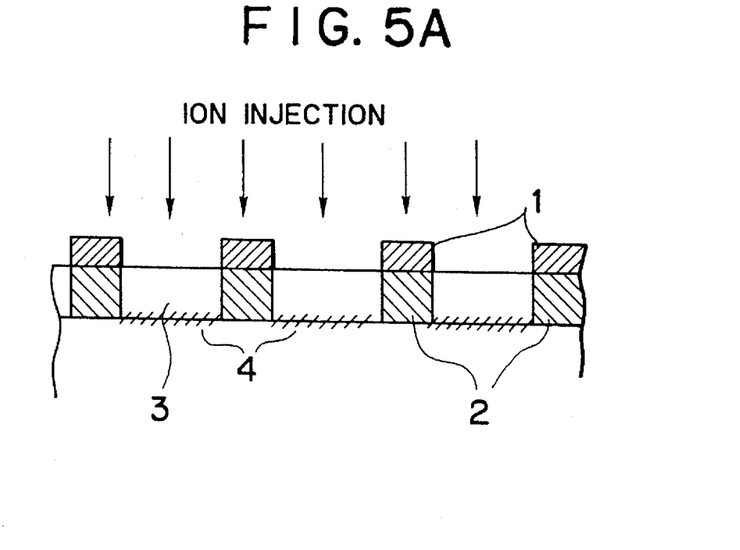
FIGS. 5A–5C are step diagrams for illustration of an embodiment of the crystal growth method of the present invention.
Figure 5B:
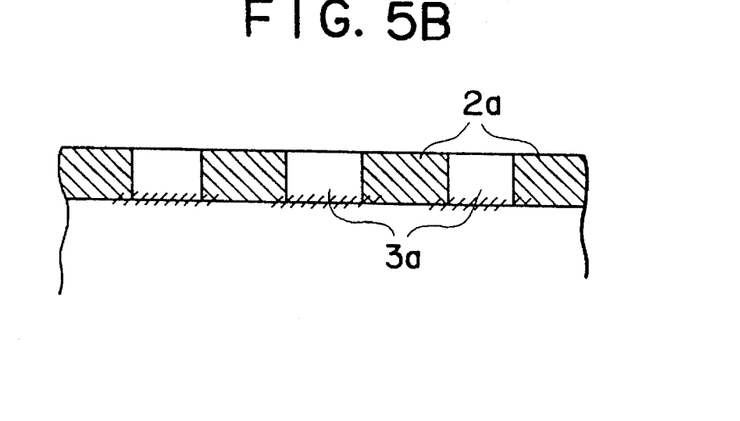
Figure 5C:
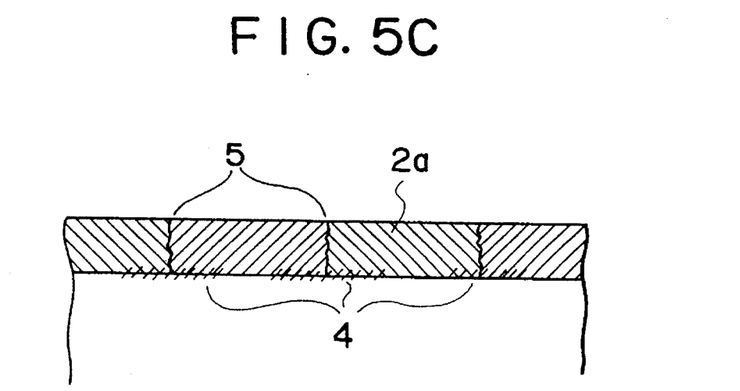

FIGS. 5A–5C are step diagrams for illustration of an embodiment of the crystal growth method of the present invention.

As shown in FIG. 5A, an amorphous film is subjected to solid phase growth to form a polycrystalline film with relatively large grain size. A mask 1 such as a resist, or the like is used to cover a first region which is smaller than the grain size of the polycrystalline film, and Si ions are injected only into other regions by selecting the injection energy so that the amorphous Si layer formed by ion-injection and the subbing interface vicinity may be damaged. Damages are given primarily to the interface vicinity at the portion not covered with the resist, and nucleus generation will be inhibited during the subsequent heat treatment. The region 3 (hereinafter called injected amorphous region; this becomes the second region) on the region where the extent of injection damage is higher (hereinafter called interface damage region 4) is not crystallized, and the region subjected to no injection damage is not made amorphous and the crystal region (hereinafter called residual crystal region; this becomes the first region) 2 remains, and is stored.

Here, for obtaining a polycrystalline film with relatively larger grain size, the film thickness of the amorphous film to be applied with the crystallization treatment may be preferably 0.05 μm to 0.3 μm, more preferably 0.05 μm to 0.2 μm, optimally 0.05 μm to 0.15 μm.

The crystallization treatment for obtaining a polycrystalline film with relatively larger grain size is practiced as described below.

It is desirable to apply heat treatment to an amorphous film under the temperature condition preferably of 550° C. to 650° C., more preferably of 575° C. to 625° C., optimally of 580° C. to 620° C.

On the other hand, when an amorphous film is formed by making a polycrystalline film amorphous, it is desirable to inject $Si^+$ ions at the interface vicinity of the thin film and substrate, thereby making the nucleation speed lower. As a specific example, into a Si thin film with a thickness of 0.1 μm, $Si^+$ ions of about $1\times10^{15} cm^{-2}$ may be injected by acceleration at 70 keV and heat treatment may be applied at 600° C. in $N_2$ for about 50 hours, whereby a large grain size polycrystalline layer with the maximum grain size of several μm can be obtained.

The size of the mask 1 which becomes the first region may be preferably 0.03 μm or more and 5 μm or less, more preferably 0.05 μm or more and 2 μm or less, optimally 0.05 μm or more and 1 μm or less, for controlling the grain size and the position of the grain boundary.

Next, the temperature and the time at which the region which has been made amorphous by injection so as not to crystallize after removal of the resist are determined from FIG. 3 and FIG. 4, and the amorphous Si layer in which Si ions are injected at the interface is subjected to heat treatment in $N_2$ or $H_2$. By such heat treatment, the crystal is elongated from the residual crystal region 2 to the injected amorphous region 3, and in the injected amorphous region 3, random nucleus generation is inhibited. For amorphous Si layer, typically a heat treatment at around 630° C. for about 100 hours is suitable.

This is because the active energy at which the atoms in the amorphous phase are incorporated into the existing crystal phase is lower than the energy for random nucleus generation beyond the surface energy disadvantage in the amorphous phase.

The temperature and time conditions for the heat treatment for growing the crystal from the above-mentioned first region to the above-mentioned second region may be preferably 550° C. to 650° C. for 30 hours to 100 hours, more preferably 575° C. to 625° C. for 40 hours to 80 hours, optimally 580° C. to 620° C. for 50 hours to 70 hours, for obtaining a polycrystalline film which is flat and has large and controlled grain sizes.

If the region on the non-interface damage region, namely the residual crystal region 2 is left to have a fine area (5 μm in diameter or less, desirably 2 μm in diameter or less, optimally 1 μm in diameter or less), enlargement of the crystal region occurs from the fine residual crystal region when heat treatment is commenced, whereby a crystal of enlarged single domain grows when the residual crystal region 2 is a single domain (FIG. 5B; 3a is an amorphous region.). The crystal phase having the single domain, when the heat treatment is continued, will move around with the interface between the crystalline phase and the amorphous phase being directed toward the outside. That is, the Si atoms within the amorphous phase will be incorporated into the crystalline phase by jumping the interface. Thus, the size of the crystal continues to be increased, but the phase transfer from the amorphous phase into the crystalline phase occurs with lower energy than the energy for nucleation of the surface energy disadvantage, and therefore the interface damage region 4 is incorporated into the single crystalline phase generated from the residual crystal region 2 before nucleation, until the adjoining crystal regions 2a are mutually collided against each other to form a crystal grain boundary 5 there (FIG. 5C).

At this time, the crystal grain size becomes equal to the interval of the non-injected residual crystal region 3, and can be freely determined. Also the crystal grain boundary position can be determined.

The amorphous thin film in the present invention is not limited to those which are formed by making polycrystalline thin films amorphous by performing ion injection into polycrystalline thin films, but may be also those having amorphous structure during deposition.

When the starting material is a polycrystalline layer, first without provision of a mask, the first ion injection is effected so that the projected flying distance may come to the vicinity of the center of the polycrystalline thin film. By such ion injection, the polycrystalline thin film can be made amorphous without providing injection damage to the vicinity of the interface between the polycrystalline thin film and the subbing substrate. Subsequently, after the whole film is made a polycrystalline film with relatively larger grain size of about 1 to 5 μm by solid phase growth, under the state provided with a mask of a resist corresponding to the fine region, the second ion injection is effected so that the projected flying distance (injection depth) may come to the vicinity of the interface between the amorphous thin film and the subbing substrate. By such ion injection, injection damage occurs at the interface vicinity between the amorphous thin film other than portions provided with the mask and the subbing substrate, while no injection damage occurs at the portions where the mask is provided, whereby the crystal phase remains.

Having described above about the embodiments in which silicon is employed as the polycrystalline film, the present invention is not limited to silicon films.

The present invention is described below by referring to Examples.

Example 1

On a subbing substrate comprising a glass, $SiH_4$ was pyrolyzed by the low pressure chemical vapor deposition method to deposit a polycrystalline Si thin film to 100 nm. The formation temperature was 620° C., the pressure 0.3 Torr and its grain size was fine, namely about 50 nm. Si injection was effected twice. First, without a resist mask, Si ions were injected into the polycrystalline Si layer in an amount of $3 \times 10^{15} cm^{-2}$ at an injection energy of 40 keV over the whole surface, whereby as described above, the damage became continuous to make it amorphous. However, the projected flying path was positioned at the vicinity of the center of film thickness of 100 nm, and consequently there is substantially no damage at the vicinity of $Si/SiO_2$ subbing interface.

When the amorphous Si film is subjected to the heat treatment at 600° C. in $N_2$ for 50 hours, it grows in solid phase to a polycrystalline Si film with grain sizes of 1 to 5 µm.

Then, a resist mask is applied with 1 µm diameter at intervals of 5 µm and 10 µm, followed by the second $Si^+$ ion injection at 70 keV to introduce a damage at the vicinity of the interface. The amount injected was made the same as in the first injection. After the resist was peeled off, heat treatment was conducted in $N_2$ at 620° C. for 100 hours. As a result, the grain sizes became 5 µm±1 µm, 10 µm±1 µm, and moreover the grain boundaries were found to be aligned in a lattice.

Figure 6:
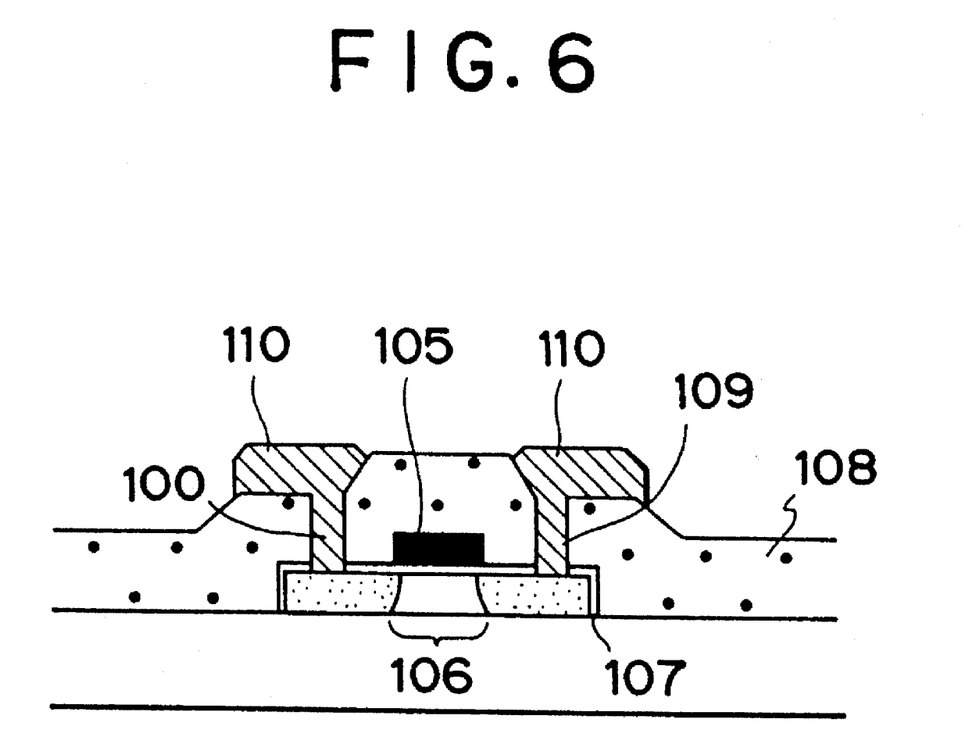
FIG. 6 is a field effect transistor formed by use of the crystal obtained by the present Example.

On the Si layer of 100 nm obtained in Example 1, a number of field effect transistors shown in FIG. 6 with a channel length of 3 µm were trially prepared by use of conventional IC process. The transistor, as shown in FIG. 6, has a gate electrode 105, a source-drain region 106, a gate insulating film 107, a contact hole 109, and a wiring 110. The electron mobility of the transistor was $200 \pm 5$ $cm^2$/V.sec, and the variance of threshold value ±0.2 V. Since it is possible to arrange the transistors so that no grain boundary may exist at the channel portion of the transistors, it has become possible to make the device characteristics higher in performance, and the distribution of the device characteristics narrower.

Example 2

An amorphous Ge thin film with a thickness of 50 nm was deposited on $SiO_2$ in vacuum by an electron beam. The deposition was carried out at a vacuum degree of $1 \times 10^{-6}$ Torr, and at a substrate temperature of room temperature. During vapor deposition, the temperature was elevated from room temperature to 100° C.

The amorphous Ge film was permitted to grow in solid phase at 350° C. in $N_2$ for 50 hours to form a polycrystalline film having grain sizes of 1 to 3 µm, followed by masking of the region of 1.5 µm in diameter and intervals of 10 µm with a resist, and $Ge^+$ ions are injected at 130 keV into the whole region. The injection amount was $2 \times 10^{15} cm^{-2}$. The injection depth of $Ge^+$ ions was about 50 nm from the surface, and the ions were injected concentratively at the vicinity of the interface with the subbing substrate to provide a damage at the interface portion. After removal of the mask, heat treatment was conducted in $N_2$ or $H_2$ atmosphere at 380° C. for 50 hours. As a result, crystals were elongated to the amorphous Ge region in which damages are introduced at the interface by Ge ions, from only the residual crystal fine regions free from damage without injection of $Ge^+$ ions covered with a mask, whereby both crystals collided against each other at the middle of the adjoining crystal nuclei generation points to form a crystal grain boundary there. As the result of examination of the crystal structure by a transmission electron microscope, the size of the crystal of each single domain had become 10 µm±1 µm.

Example 3

A polycrystalline Ge thin film was formed on $SiO_2$ to a thickness of 50 nm by $GeH_4$ pyrolysis according to the low pressure CVD method at a deposition temperature of 400° C. The polycrystalline Ge deposited as such was observed to have a grain size of about 100 nm by a transmission electron microscope. Next, $Ge^+$ ions were injected at an injection energy of 60 keV in an amount of $2 \times 10^{15} cm^{-2}$ to make the whole film amorphous. The injection depth by the injection energy of 60 keV was about 25 nm from the surface, and at this time substantially no damage was introduced into the Ge film/$SiO_2$ subbing substrate interface.

The amorphous Ge film was permitted to grow in solid phase in $N_2$ at 360° C. for 50 hours to form a polycrystalline film having grain sizes of 1 to 4 µm, followed further by masking with a resist at the portion of 1.2 µm in diameter at the intervals of 15 µm, and $Ge^+$ ions were injected at 130 keV in an amount of $2 \times 10^{15} cm^{-2}$. At this time, damages were introduced primarily at the interface (Ge/$SiO_2$) of the injected region. After removal of the resist mask, heat treatment was applied in $N_2$ at 390° C. for 60 hours.

From the fine residual crystal region subjected to no damage at the interface of the Ge film, the crystal is elongated to the region where damages are introduced at the interface while the crystal maintains its structure, until finally it is collided against the adjoining crystal to form a grain boundary at the middle of the adjoining fine interface non-damaged regions.

As the result of examination by a transmission electron microscope, the grain size was found to be 15 µm±2 µm.

Example 4

On a quartz substrate, an amorphous Si was deposited with a film thickness of 100 nm according to the electron beam vapor deposition method in ultrahigh vacuum under the following conditions:

vacuum degree reached: $1 \times 10^{10}$ Torr vacuum degree during vapor deposition: $5 \times 10^{10}$ Torr substrate temperature: 300° C.

deposition speed: ca. 100 nm/hr.

The amorphous Si thin film was subjected to solid phase growth in $N_2$ at 600° C. for 50 hours to form a polycrystalline film having grain sizes of 1 to 4 µm, a resist was patterned on the polycrystalline Si thin film by conventional photolithographic steps so that regions of 1 µm square remained in lattice spots with intervals of 10 µm.

Further, into the whole substrate were injected $Si^+$ ions accelerated to an energy of 70 keV in an amount of $1 \times 10^{15} cm^{-2}$. In this case the projected flying distance of Si ion in Si is 99.7 nm and therefore the region not covered with the resist becomes amorphous Si, whereby most Si ions are distributed at the vicinity of the interface with the quartz substrate to introduce much damages at the interface.

After removal of the resist, heat treatment was conducted by maintaining the substrate temperature at 590° C. in $N_2$ atmosphere. After 15 hours from initiation of the heat treatment, no nucleation occurred in the region, without coverage with the resist where Si ions were injected, from the residual crystal region of 1 μm square, without injection of Si ions, and therefore annealing was further continued, whereby the crystals already formed in the region began to be grown in the lateral direction beyond that region. And when annealing was continued for about 120 hours, the crystal became contacted at the growth end face with the crystal grain from the adjoining region apart by about 10 μm therefrom to form a grain boundary, whereby the amorphous Si thin film was crystallized over substantially the whole region. As a result, while arranging crystal boundaries substantially in a lattice with 10 μm intervals, a thin film crystal comprising a groups of crystals with an average grain size of 10 μm was obtained.

What is claimed is:

1. A method for producing film having large size crystal grains with a narrow grain size distribution, said method comprising the steps of:

providing an amorphous film of a crystallizable material on a surface of a substrate;

converting said amorphous film to a polycrystalline film by applying heat at an elevated temperature not higher than a melting point of said amorphous film;

applying a patterned mask on a surface of said polycrystalline film, said mask covering first regions of said polycrystalline film but leaving second regions of said polycrystalline film exposed;

irradiating said polycrystalline film with ions of said crystallizable material to inject said ions into said second regions to a penetration depth not less than the thickness of said polycrystalline film whereby said second regions are converted to an amorphous state having a disordered structure at each interface between each second region and said substrate;

removing said mask; and growing a crystal grain from each first region by applying heat continuously at an elevated temperature not higher than the melting point of said amorphous film in an atmosphere of either hydrogen or nitrogen until each second region in said amorphous state is converted to a polycrystalline state consisting of crystal grains grown from said first regions.

2. A method according to claim 1, wherein said amorphous film has a thickness in the range of about 0.05 to 0.3 μm.

3. A method according to claim 2, wherein said step of providing said amorphous film is performed by depositing said crystallizable material on said surface of said substrate to produce a first polycrystalline film and then converting said first polycrystalline film to said amorphous film by irradiating said first polycrystalline film with ions of said crystallizable material to inject said ions to a penetration depth less than the thickness of said first polycrystalline film, thereby avoiding damage in the vicinity of a film-substrate interface.

4. A method according to claim 3, wherein said patterned mask is formed to cover said first regions of said polycrystalline film of a diameter of 5 μm or less.

5. A method according to claim 4, wherein said patterned mask defines covered first regions of said polycrystalline film at intervals of 5 to 15 μm.

6. A method according to claim 3, wherein said patterned mask defines covered first regions of said polycrystalline film at intervals of 5 to 15 μm.

7. A method according to claim 2, wherein said patterned mask is formed to cover said first regions of said polycrystalline film of a diameter of 5 μm or less.

8. A method according to claim 7, wherein said patterned mask defines covered first regions of said polycrystalline film at intervals of 5 to 15 μm.

9. A method according to claim 2, wherein said patterned mask defines covered first regions of said polycrystalline film at intervals of 5 to 15 μm.

10. A method according to claim 2, wherein said step of providing said amorphous film is performed by depositing said crystallizable material on said surface of said substrate to produce a first polycrystalline film and then converting said first polycrystalline film to said amorphous film by irradiating said first polycrystalline film with ions of said crystallizable material to inject said ions to a penetration depth less than the thickness of said first polycrystalline film, thereby avoiding damage in the vicinity of a film-substrate interface.

11. A method according to claim 10, wherein said patterned mask is formed to cover said first regions of said polycrystalline film of a diameter of 5 μm or less.

12. A method according to claim 11, wherein said patterned mask defines covered first regions of said polycrystalline film at intervals of 5 to 15 μm.

13. A method according to claim 10, wherein said patterned mask defines covered first regions of said polycrystalline film at intervals of 5 to 15 μm.

14. A method according to claim 1, wherein said patterned mask is formed to cover said first regions of said polycrystalline film of a diameter of 5 μm or less.

15. A method according to claim 14, wherein said patterned mask defines covered first regions of said polycrystalline film at intervals of 5 to 15 μm.

16. A method according to claim 1, wherein said patterned mask defines covered first regions of said polycrystalline film at intervals of 5 to 15 μm.

17. A method according to any of claims 1–12, wherein said crystallizable material is either silicon or germanium.

18. A method according to claim 17, wherein said crystallizable material is silicon and said substrate is of either glass or quartz.

19. A method according to claim 17, wherein said crystallizable material is germanium and said substrate is silicon dioxide.

* * * * *

UNITED STATES PATENT AND TRADEMARK OFFICE
CERTIFICATE OF CORRECTION

PATENT NO. : 5,457,058
DATED : October 10, 1995
INVENTOR(S) : TAKAO YONEHARA

It is certified that error appears in the above-indentified patent and that said Letters Patent is hereby corrected as shown below:

<u>ON TITLE PAGE</u>

In [56] References Cited, under FOREIGN PATENT DOCUMENTS:
"0020134  10/1980  European Pat. Off." should read
--0020134  12/1980  European Pat. Off.--;
"1239093  9/1989  Japan" should read
--1-239093  9/1989  Japan--; and
"1239094  9/1989  Japan" should read
--1-239094  9/1989  Japan--.

<u>COLUMN 1</u>

Line 33, "than" should be deleted and "of" (second occurrence) should be deleted.
Line 34, "polycrystals" should be deleted and "Si, etc." should read --Si--.

<u>COLUMN 2</u>

Line 9, "grains" should read --grain--. (2nd Occurr)
Line 31, "FIG. 2(53" should read --FIG. 2 (53--.
Line 33, "methods," should read --method,--.
Line 37, "method" should read --method,--.

<u>COLUMN 3</u>

Line 42, "fact" should read --facts.--.
Line 43, "fact" should read --facts-- and "described in detail." should read --described.--.
Line 63, "is" should be deleted. (2nd Occurr.)

<u>COLUMN 4</u>

Line 10, "use" should read --use of--.

UNITED STATES PATENT AND TRADEMARK OFFICE
CERTIFICATE OF CORRECTION

PATENT NO. : 5,457,058
DATED : October 10, 1995
INVENTOR(S) : TAKAO YONEHARA

It is certified that error appears in the above-indentified patent and that said Letters Patent is hereby corrected as shown below:

COLUMN 7

Line 38, "trially" should be deleted.

COLUMN 8

Line 3, "region" should read --region,--.

COLUMN 9

Line 52, "claim 2," should read --claim 1,--.

COLUMN 10

Line 49, "claims 1-12," should read --claims 1-15,--.

Signed and Sealed this

Thirtieth Day of April, 1996

Attest:

BRUCE LEHMAN

Attesting Officer       Commissioner of Patents and Trademarks